United States Patent
Fujiwara et al.

(10) Patent No.: US 10,141,643 B2
(45) Date of Patent: Nov. 27, 2018

(54) HIGH-FREQUENCY FILTER INCLUDING MATCHING CIRCUIT

(71) Applicant: SKYWORKS FILTER SOLUTIONS JAPAN CO., LTD., Kadoma-Shi (JP)

(72) Inventors: Joji Fujiwara, Osaka-Fu (JP); Tetsuya Tsurunari, Osaka-Fu (JP); Tomoya Komatsu, Osaka-Fu (JP); Hiroyuki Nakamura, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 486 days.

(21) Appl. No.: 14/875,153

(22) Filed: Oct. 5, 2015

(65) Prior Publication Data

US 2016/0028156 A1    Jan. 28, 2016

Related U.S. Application Data

(63) Continuation of application No. 14/241,877, filed as application No. PCT/JP2012/006808 on Oct. 24, 2012, now Pat. No. 9,166,558.

(30) Foreign Application Priority Data

Nov. 28, 2011    (JP) .................................. 2011-259362

(51) Int. Cl.
    *H03H 9/70* (2006.01)
    *H01Q 5/335* (2015.01)
    (Continued)

(52) U.S. Cl.
    CPC ............... *H01Q 5/335* (2015.01); *H01Q 1/50* (2013.01); *H03F 3/189* (2013.01);
    (Continued)

(58) Field of Classification Search
    CPC .................................. H03H 7/46; H03H 9/725
    (Continued)

(56) References Cited

U.S. PATENT DOCUMENTS

| 6,606,016 B2 | 8/2003 | Takamine |
| 7,567,148 B2 * | 7/2009 | Schmidhammer ... H03H 9/0028 333/133 |

(Continued)

FOREIGN PATENT DOCUMENTS

| CN | 1319950 A | 10/2001 |
| JP | 2000315936 A | 11/2000 |

(Continued)

OTHER PUBLICATIONS

International Search Report issued in International Application No. PCT/JP2012/006808 dated Jan. 22, 2013.

*Primary Examiner* — John W Poos
(74) *Attorney, Agent, or Firm* — Lando & Anastasi, LLP

(57) ABSTRACT

A high-frequency filter includes a first output to output a first signal, a first filter, a second filter, and a first matching circuit connected to an output of the first filter and to an output of the second filter. The first signal is provided to the first output from one of the output of the first filter and the output of the second filter via the first matching circuit. The first matching circuit includes a resonator connected in series between the first output and the output of only one of the first filter and the second filter.

7 Claims, 13 Drawing Sheets

(51) Int. Cl.
    *H04B 1/00* (2006.01)
    *H04B 1/04* (2006.01)
    *H04B 1/525* (2015.01)
    *H03F 3/189* (2006.01)
    *H03H 7/38* (2006.01)
    *H03H 7/46* (2006.01)
    *H03H 11/34* (2006.01)
    *H01Q 1/50* (2006.01)
    *H03H 7/01* (2006.01)
    *H03H 9/24* (2006.01)
    *H03H 9/00* (2006.01)
    *H04B 1/3816* (2015.01)

(52) U.S. Cl.
    CPC ............ *H03H 7/0161* (2013.01); *H03H 7/38* (2013.01); *H03H 7/465* (2013.01); *H03H 9/24* (2013.01); *H03H 9/70* (2013.01); *H03H 11/344* (2013.01); *H04B 1/006* (2013.01); *H04B 1/0458* (2013.01); *H04B 1/0483* (2013.01); *H04B 1/525* (2013.01); *H03F 2200/165* (2013.01); *H03F 2200/451* (2013.01); *H03H 7/46* (2013.01); *H03H 9/0004* (2013.01); *H04B 1/3816* (2013.01)

(58) Field of Classification Search
    USPC .................................................. 333/132, 133
    See application file for complete search history.

(56) References Cited

U.S. PATENT DOCUMENTS

| | | | |
|---|---|---|---|
| 2002/0101296 A1* | 8/2002 | Uriu | H01P 1/15 333/132 |
| 2003/0006859 A1 | 1/2003 | Taniguchi | |
| 2006/0044080 A1 | 3/2006 | Hagiwara et al. | |
| 2007/0046395 A1 | 3/2007 | Tsutsumi et al. | |
| 2008/0238567 A1 | 10/2008 | Rosetti et al. | |
| 2010/0188165 A1 | 7/2010 | Nakamura et al. | |
| 2010/0194494 A1 | 8/2010 | Inoue et al. | |

FOREIGN PATENT DOCUMENTS

| | | |
|---|---|---|
| JP | 2001326557 A | 11/2001 |
| JP | 2002528946 A | 9/2002 |
| JP | 2004166258 A | 6/2004 |
| JP | 2009508417 A | 2/2009 |
| JP | 2010045563 A | 2/2010 |
| JP | 2010178186 A | 8/2010 |
| WO | 0024124 A1 | 4/2000 |
| WO | 2010023168 A1 | 3/2010 |
| WO | 2011001769 A1 | 1/2011 |

* cited by examiner

1000

HIGH-FREQUENCY FILTER INCLUDING MATCHING CIRCUIT

RELATED APPLICATIONS

This application claims priority under 35 U.S.C. § 120 as a continuation of U.S. patent application Ser. No. 14/241,877, titled "HIGH-FREQUENCY FILTER," filed on Feb. 27, 2014, which is herein incorporated by reference in its entirety. U.S. patent application Ser. No. 14/241,877 is a national stage entry under 35 U.S.C. § 371 of PCT Application Serial No. PCT/JP2012/006808, titled "HIGH-FREQUENCY FILTER," filed on Oct. 24, 2012. PCT Application Serial No. PCT/JP2012/006808 claims priority to Japanese Patent Application No. 2011-259362, filed on Nov. 28, 2011.

TECHNICAL FIELD

The present invention relates to a high-frequency filter.

BACKGROUND ART

The number of duplexers mounted on a mobile phone has been increasing associated with the mobile phone's ability to handle multiple bands and multiple modes. On the other hand, in order to solve the shortage of space caused by acceleration in adding multiple functions to the mobile phone, the request for reducing size of a wireless section has become strong. Because of such background, expectation is high for a multi-duplexer module having integrated therein multiple duplexers.

Patent Literature 1 discloses a multi-duplexer module 1000 shown in FIG. 12. The multi-duplexer module 1000 includes an antenna terminal 1002, a matching circuit 1031, a first duplexer 1032, and a second duplexer 1033. The first duplexer 1032 and the antenna terminal 1002 are connected via the matching circuit 1031.

CITATION LIST

Patent Literature

[PTL 1] Japanese Laid-Open Patent Publication No, 2010-45563
[PTL 2] Japanese Laid-Open Patent Publication No. 2000-315936

SUMMARY OF THE INVENTION

Problems to be Solved by the Invention

FIG. 13 shows an example of connection between the multi-duplexer module, and an antenna and a transceiver. In the example shown in (a) of FIG. 13, transmission side terminals and reception side terminals of the first duplexer 1032 and the second duplexer 1033 are each connected to a terminal of the transceiver via PAs (amplifiers) 1101 to 1104 through wiring. Furthermore, as in the example shown in (b) of FIG. 13, it has been considered assigning multiple functions to a PA. In this example, each of the transmission side terminals of the first duplexer 1032 and the second duplexer 1033 is connected to a terminal of the transceiver via a switch 1301. When passbands of each transmission side filter of the first duplexer 1032 and the second duplexer 1033 overlap or are adjacent to each other, multiple functions can be assigned to the PA 1102 by including the switch 1301.

However, when a plurality of transmission-and-reception filters such as duplexers are arranged, various problems occur such as wiring becoming complicated, power consumption increasing due to insertion loss by a newly added switch, distortion being generated by the switch, and needing an additional circuit and wiring for switch control.

Thus, an objective of the present invention is to provide a high-frequency filter that is capable of handling multiple bands and that allows assigning multiple functions to a PA and simplifying wiring and circuits without using a switch.

Solution to the Problems

The present invention is a high-frequency filter including a first filter, a second filter, and a first matching circuit connected to an input side of the first filter and an input side of the second filter. Furthermore, a first input, which is an input to the high-frequency filter, is inputted to the first filter or the second filter via the first matching circuit.

Furthermore, the first matching circuit includes at least one first resonator, and the at least one resonator is connected in series to an input side of, among the first filter and the second filter, a filter whose passband is a higher frequency band.

The high-frequency filter further includes a first reception filter and a second reception filter. Furthermore, the first input is a transmission signal, the first filter and the second filter are respectively a first transmission filter and a second transmission filter to both of which the transmission signal is inputted, and a reception signal, which is a second input inputted to the high-frequency filter, is inputted to the first reception filter and the second reception filter.

Furthermore, the high-frequency filter further includes a second matching circuit connected to an output side of the first reception filter and an output side of the second reception filter.

Furthermore, the second matching circuit includes at least one second resonator, and the at least one second resonator is connected in series to an input side of, among the first reception filter and the second reception filter, a filter whose passband is a higher frequency band.

Furthermore, at least one set, selected from a set including the first transmission filter and the first reception filter and a set including the second transmission filter and the second reception filter, is formed as a duplexer.

Furthermore, a frequency band of a passband of the second transmission filter is higher than a frequency band of a passband of the first transmission filter, a frequency band of a passband of the second reception filter is higher than a frequency band of a passband of the first reception filter, and the frequency band of the passband of the second transmission filter and the frequency band of the passband of the first reception filter partially overlap.

Furthermore, at least one among the first transmission filter, the second transmission filter, the first reception filter, and the second reception filter is formed from an elastic wave filter that utilizes non-leakage elastic waves.

Furthermore, the high-frequency filter further may include an amplifier, wherein the first input may be amplified by the amplifier, and may be inputted to the first filter or the second filter via the first matching circuit.

Furthermore, the high-frequency filter may further include an antenna switch connected to output sides of each of the transmission filters and input sides of each of the reception filters.

Advantageous Effects of the Invention

With the high-frequency filter of the present invention, it is possible to assign multiple functions to a PA and simplify wiring and circuits, without using a switch.

DESCRIPTION OF EMBODIMENTS

First Embodiment

Figure 1:
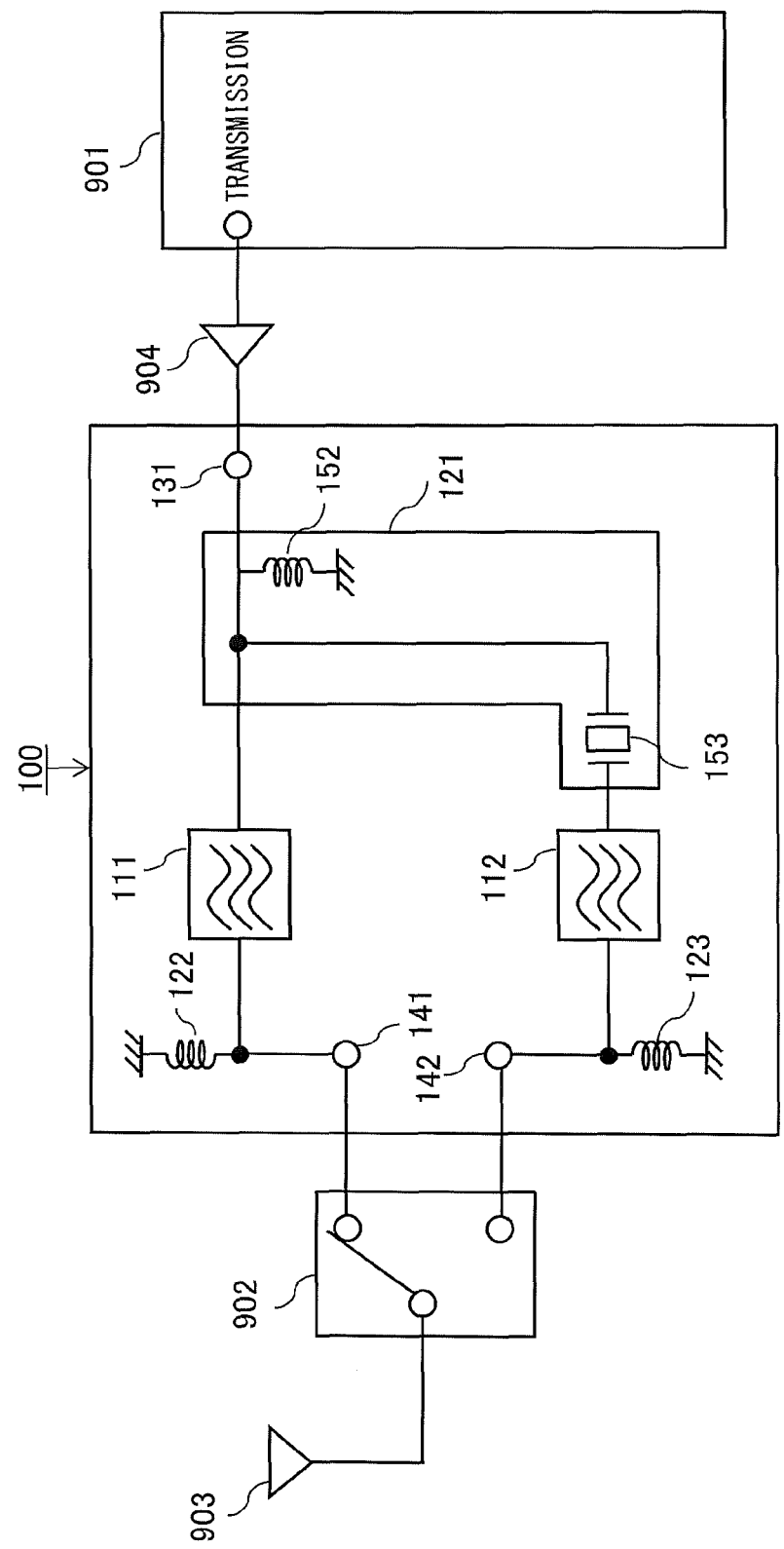
FIG. 1 shows the configuration and connection mode of a high-frequency filter according to a first embodiment of the present invention.

In the following, a first embodiment of the present invention will be described. FIG. 1 shows the configuration of a high-frequency filter 100 according to the present embodiment, and one example of its connection with an antenna, a transceiver, etc. The high-frequency filter 100 includes a substrate 101 and components disposed on the substrate, such as a first transmission filter 111, a second transmission filter 112, a first matching circuit 121, an input terminal 131 to which transmission signals outputted from a transceiver 901 and amplified by a PA 904 are inputted, a first antenna terminal 141, and a second antenna terminal 142. Transmission signals are inputted to the input terminal 131. The input terminal 131 is connected to the first transmission filter 111 and the second transmission filter 112 via the first matching circuit 121. Outputs of the first transmission filter 111 and the second transmission filter 112 are respectively connected to the first antenna terminal 141 and the second antenna terminal 142. The first antenna terminal 141 and the second antenna terminal 142 are connected to an antenna 903 via an antenna switch 902.

The first transmission filter 111 and the second transmission filter 112 may be formed from, for example, elastic wave filters such as DMS filters and rudder type filters utilizing non-leakage waves.

The first matching circuit 121 performs matching between the first transmission filter 111 and the second transmission filter 112. The first matching circuit 121 can be achieved by grounding and connecting an inductor 152 parallel with respect to a signal route, and connecting, in series, a first resonator 153 to an input side of at least one of the first transmission filter 111 and the second transmission filter 112. The first resonator 153 is preferably connected in series to an input side of, among the first transmission filter 111 and the second transmission filter 112, the one whose passband is a higher frequency band. The first resonator 153 has characteristics of a capacitor, and functions as a high pass filter when connected in series. Therefore, when the first resonator 153 is connected in series to an input side of a transmission filter whose passband is a higher frequency band, it is possible to suppress transmission signals corresponding to a low frequency band from being inputted to the transmission filter. In the present embodiment, the frequency band of the passband of the second transmission filter 112 is set to be higher than the frequency band of the passband of the first transmission filter 111, and the first resonator 153 is connected in series to the input side of the second transmission filter 112. It should be noted that a resonator may be connected in series to each of both the input side of the first transmission filter 111 and the input side of the second transmission filter 112. Furthermore, the first matching circuit 121 may be formed using other circuit configurations.

Furthermore, as shown in FIG. 1, matching circuits 122 and 123 may be further disposed respectively between the first transmission filter 111 and the first antenna terminal 141, and between the second transmission filter 112 and the second antenna terminal 142.

When the first matching circuit 121 is disposed on each of the input sides of the first transmission filter 111 and the second transmission filter 112, passband characteristics of each of the first transmission filter 111 and the second transmission filter 112 are exerted even if transmission signals are inputted through the same wiring, and thereby the PA 904 and the wiring between a transmission signal output terminal of the transceiver 901 and the input terminal 131 of the high-frequency filter 100 can be assigned with multiple functions. With this, it becomes unnecessary to provide a switch for switching an input destination of transmission signals or a circuit for controlling this switching, and thereby wiring and circuits can be simplified.

Second Embodiment

Figure 2:
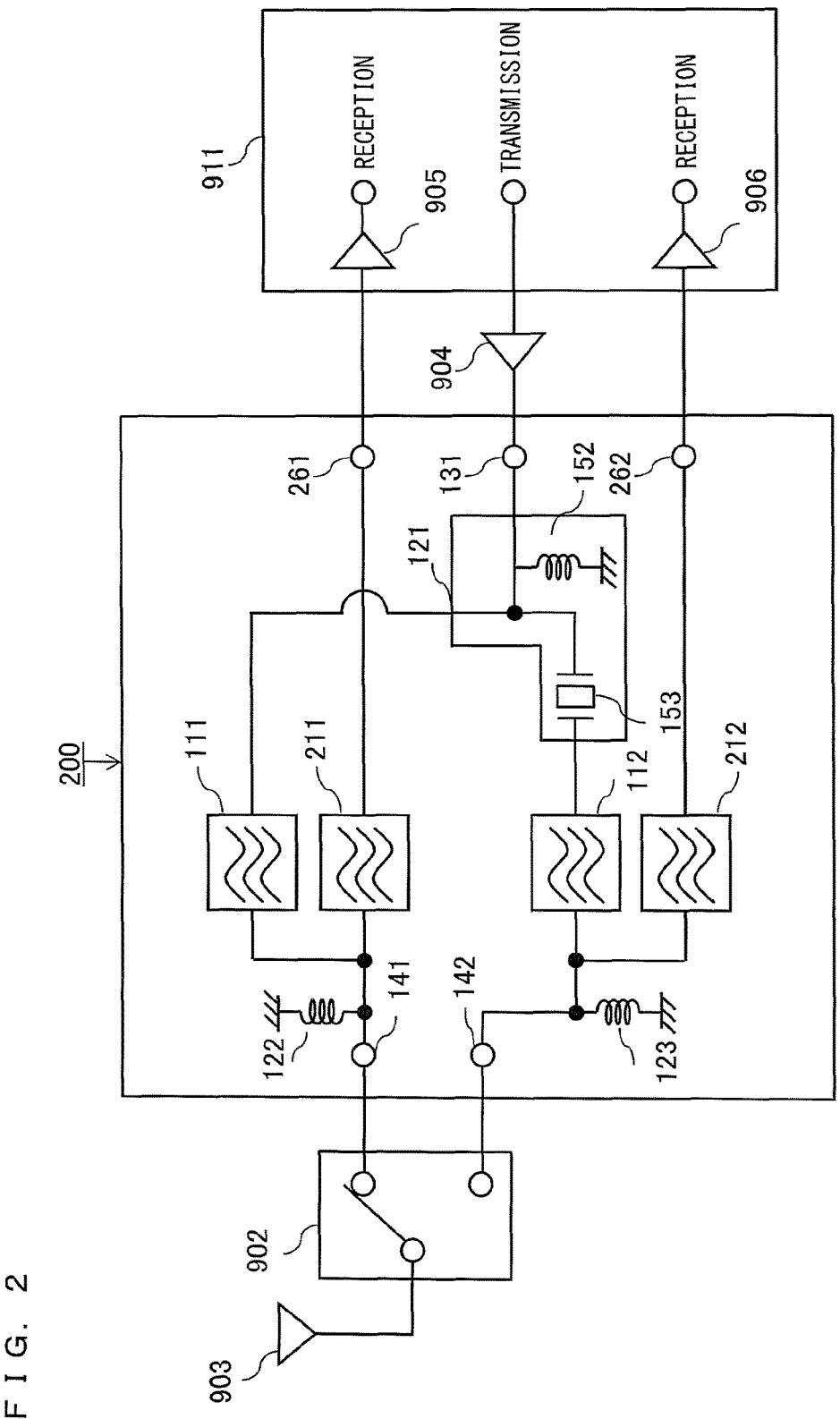
FIG. 2 shows the configuration and connection mode of the high-frequency filter according to a second embodiment of the present invention.

In the following, a second embodiment of the present invention will be described. FIG. 2 shows the configuration of a high-frequency filter 200 according to the present embodiment, and one example of its connection with an antenna, a transceiver, etc. The high-frequency filter 200 is obtained by further including, to the high-frequency filter 100 according to the first embodiment, a first output terminal 261, a second output terminal 262, a first reception filter 211, and a second reception filter 212.

Reception signals from the antenna 903 are branched at the antenna switch 902 and inputted to the first antenna terminal 141 and the second antenna terminal 142. Reception signals inputted to the first antenna terminal 141 are inputted to the first reception filter 211, and reception signals inputted to the second antenna terminal 142 are inputted to the second reception filter 212. Furthermore, an output of the first reception filter 211 is connected to the first output terminal 261, and an output of the second reception filter 212 is connected to the second output terminal 262. The first output terminal 261 and the second output terminal 262 are connected to a transceiver 911, and a PA 905 and a PA 906, built in the transceiver 911, amplify reception signals.

The first reception filter 211 and the second reception filter 212 may be formed from, for example, elastic wave filters such as DMS filters and rudder type filters utilizing non-leakage waves.

Also in the present embodiment, the PA 904 and the wiring between a transmission signal output terminal of the transceiver 911 and the input terminal 131 of the high-frequency filter 200 are assigned with multiple functions. With this, similarly to the first embodiment, it becomes unnecessary to provide a switch for switching an input destination of transmission signals or a circuit for controlling this switching, and thereby wiring and circuits can be simplified.

Third Embodiment

Figure 3:
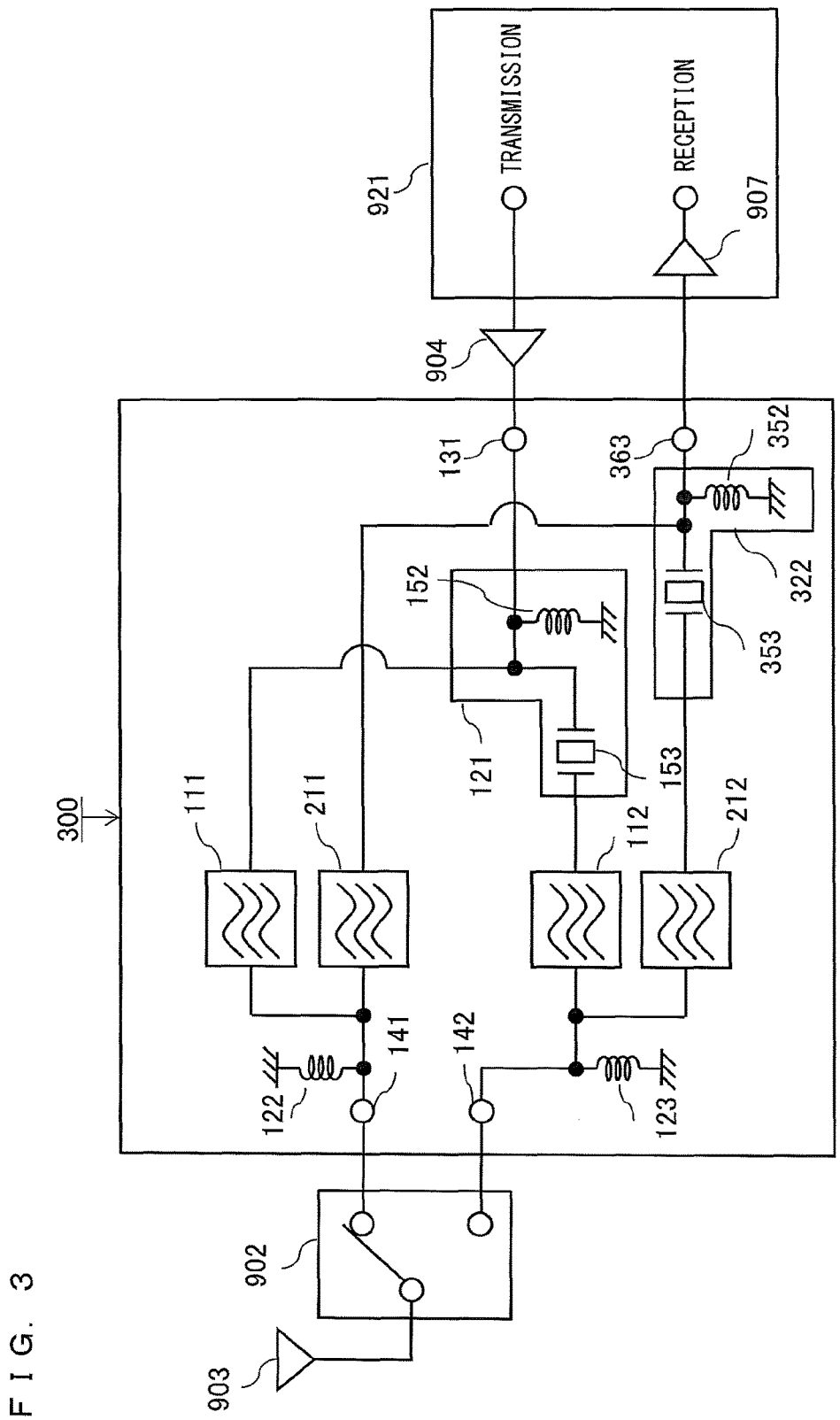
FIG. 3 shows the configuration and connection mode of the high-frequency filter according to a third embodiment of the present invention.

In the following, a third embodiment of the present invention will be described. FIG. 3 shows the configuration of a high-frequency filter 300 according to the present embodiment, and one example of its connection with an antenna, a transceiver, etc. The high-frequency filter 300 is obtained by further including, to the high-frequency filter 200 according to the second embodiment, a second matching circuit 322 connected to the output side of the first reception filter 211 and the output side of the second reception filter 212, and by including, instead of the first output terminal 261 and the second output terminal 262, a third output terminal 363 to which each of the outputs of the first reception filter 211 and the second reception filter 212 are connected via the second matching circuit 322.

The second matching circuit 322 performs matching between the first reception filter 211 and the second reception filter 212. The second matching circuit 322 can be achieved by grounding and connecting an inductor 352 parallel with respect to a signal route, and connecting, in series, a second resonator 353 to an output side of at least one of the first reception filter 211 and the second reception filter 212. The second resonator 353 is preferably connected in series to an output side of, among the first reception filter 211 and the second reception filter 212, a reception filter whose passband is a higher frequency band. With this, reception signals corresponding to a low frequency band can be removed from the output of the reception filter. In the present embodiment, the frequency band of the passband of the second reception filter 212 is set to be higher than the frequency band of the passband of the first reception filter 211, and the second resonator 353 is connected in series to the output side of the second reception filter 212. It should be noted that a resonator may be connected in series to each of both the output side of the first reception filter 211 and the output side of the second reception filter 212. Furthermore, the second matching circuit 322 may be formed using other circuit configurations.

Also in the present embodiment, the PA 904 and the wiring between a transmission signal output terminal of a transceiver 921 and the input terminal 131 of the high-frequency filter 300 are assigned with multiple functions. Furthermore, the third output terminal 263 is connected to the transceiver 921, and a PA 907 built in the transceiver 921 amplifies reception signals. Thus, the PA 907 and the wiring between a reception signal input terminal of the transceiver 921 and the third output terminal 363 of the high-frequency filter 300 are assigned with multiple functions. With this, the wiring can be further simplified.

Fourth Embodiment

Figure 4:
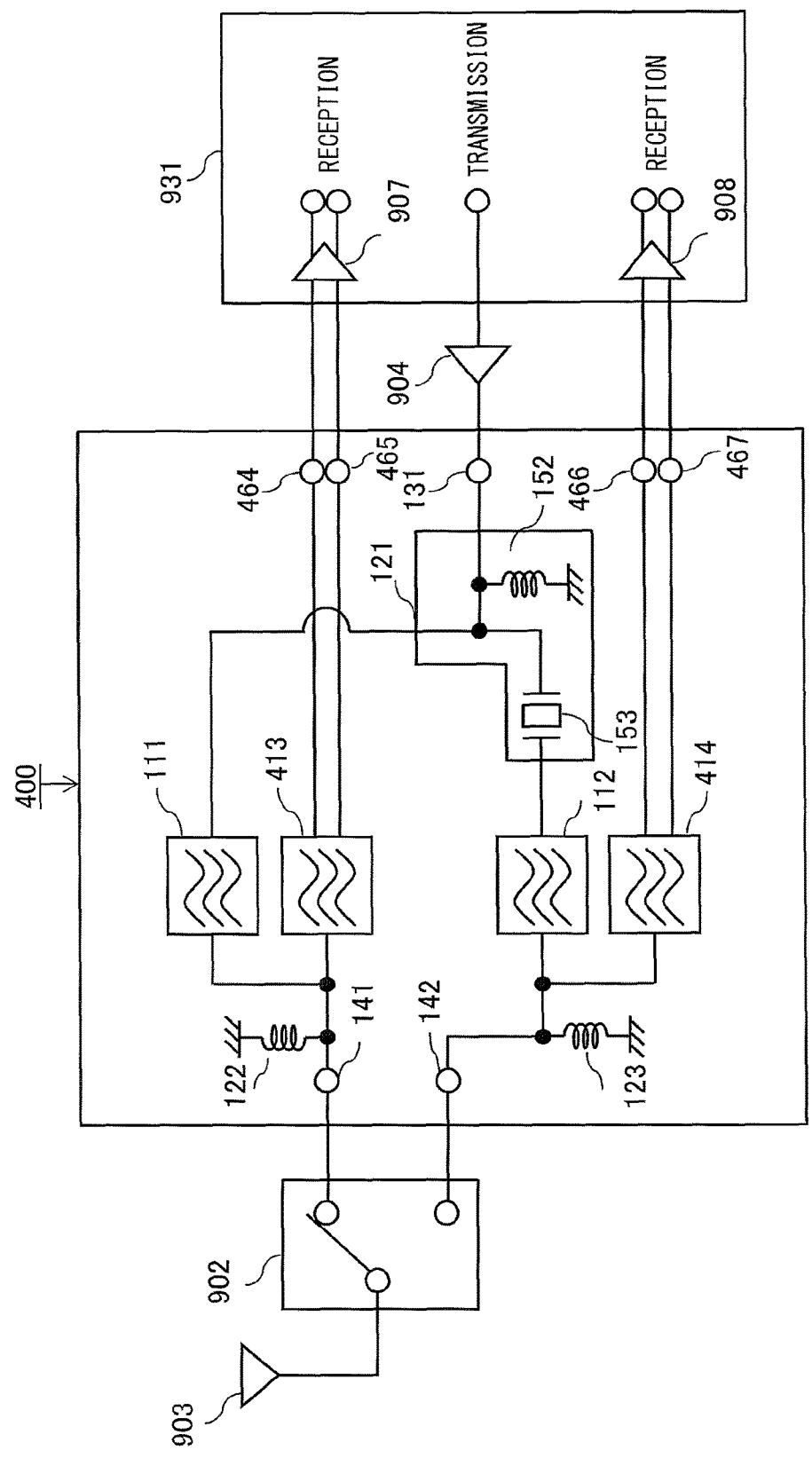
FIG. 4 shows the configuration and connection mode of the high-frequency filter according to a fourth embodiment of the present invention.

In the following, a fourth embodiment of the present invention will be described. FIG. 4 shows the configuration of a high-frequency filter 400 according to the present embodiment, and one example of its connection with an antenna, a transceiver, etc. The high-frequency filter 400 is obtained by including, to the high-frequency filter 200 according to the second embodiment, a filter 413 and a filter 414 each having an unbalanced-balanced conversion function as the first reception filter 211 and the second reception filter 212, and by including fourth to seventh output terminals 464, 465, 466, and 467 instead of the first output terminal 261 and the second output terminal 262. Two output signal lines of the first reception filter 413 are respectively connected to the fourth output terminal 464 and the fifth output terminal 465, and two output signal lines of the second reception filter 414 are respectively connected to the sixth output terminal 466 and the seventh output terminal 467.

The first reception filter 413 and the second reception filter 414 may be formed from, for example, elastic wave filters such as DMS filters and rudder type filters utilizing non-leakage waves.

Also in the present embodiment, the PA 904 and the wiring between a transmission signal output terminal of a transceiver 931 and the input terminal 131 of the high-frequency filter 200 are assigned with multiple functions. With this, similarly to the first embodiment, it becomes unnecessary to provide a switch for switching an input destination of transmission signals or a circuit for controlling this switching, and thereby wiring and circuits can be simplified.

Fifth Embodiment

Figure 5:
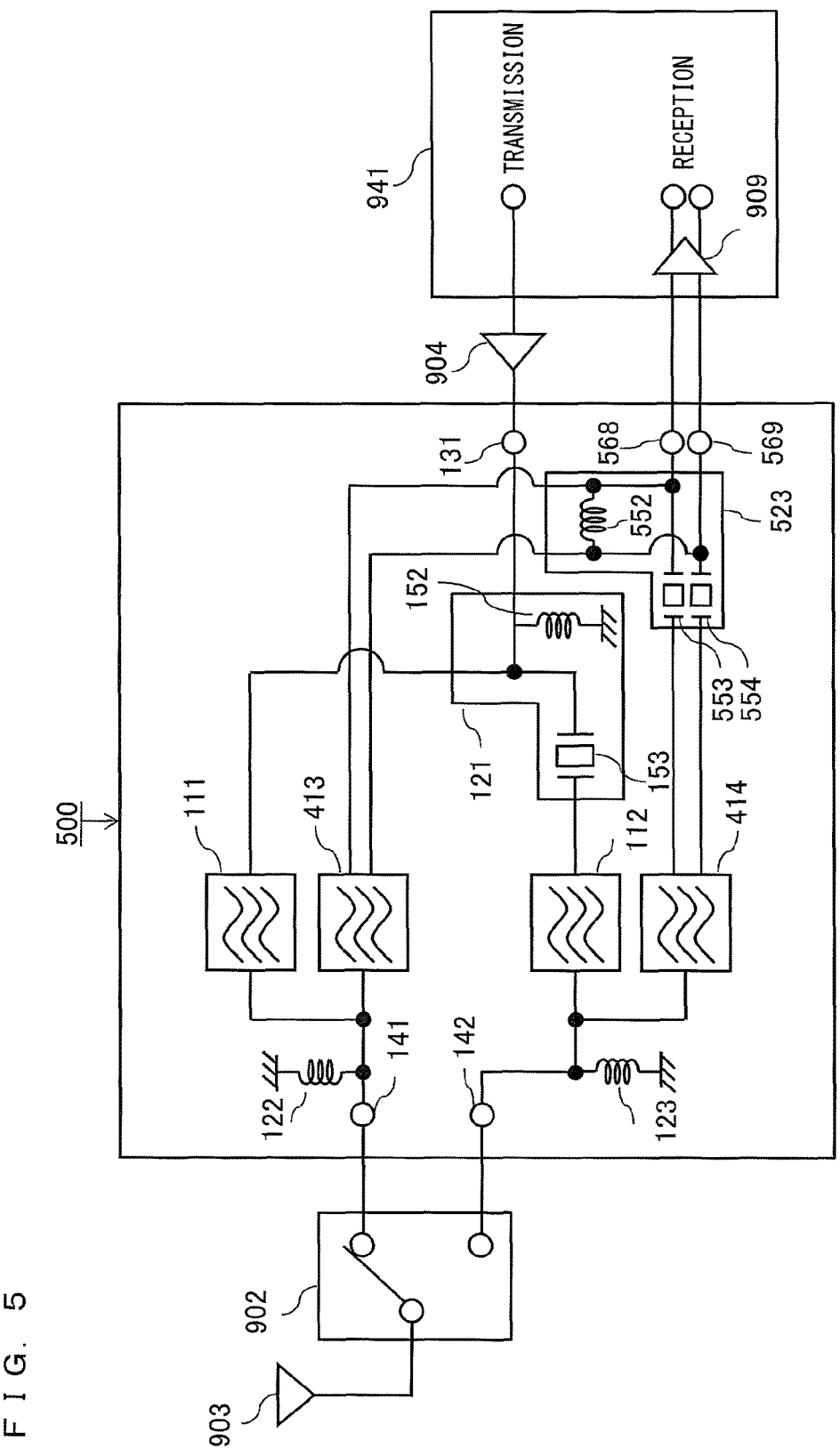
FIG. 5 shows the configuration and connection mode of the high-frequency filter according to a fifth embodiment of the present invention.

In the following, a fifth embodiment of the present invention will be described. FIG. 5 is a configurational drawing of a high-frequency filter 500 according to the present embodiment. The high-frequency filter 500 is obtained by including, to the high-frequency filter 300 according to the third embodiment, the first reception filter 413 and the second reception filter 414 each having an unbalanced-balanced conversion function as the first reception filter 211 and the second reception filter 212 similarly to the fourth embodiment, by including an eighth output terminal 568 and a ninth output terminal 569 instead of the third output terminal 363, and by including a third matching circuit 523 instead of the second matching circuit 322. Two output signal lines of the first reception filter 413 are respectively connected to the eighth output terminal 568 and the ninth output terminal 569, and two output signal lines of the second reception filter 414 are also respectively connected to the eighth output terminal 568 and the ninth output terminal 569.

The third matching circuit 523 performs matching between the first reception filter 413 and the second reception filter 414. The third matching circuit 523 can be attained by connecting an inductor 552 between the eighth output terminal 568 and the ninth output terminal 569, and by serially connecting a third resonator 553 and a fourth resonator 554 to the output signal lines on the output side of, among the first reception filter 413 and the second reception filter 414, the one whose passband is a higher frequency band. By serially connecting a resonator to the output side of a reception filter whose passband is a higher frequency band, reception signals corresponding to a low frequency band can be removed from the output of the reception filter. In the present embodiment, the frequency band of the passband of the second reception filter 414 is set to be higher than the frequency band of the passband of the first reception filter 413, and the third resonator 553 and the fourth resonator 554 are connected in series to the output side of the second reception filter 414. It should be noted that a resonator may be connected in series to each of both the output side of the first reception filter 211 and the output side of the second reception filter 212. Furthermore, the third matching circuit 523 may be formed using other circuit configurations.

Also in the present embodiment, the PA 904 and the wiring between a transmission signal output terminal of a transceiver 941 and the input terminal 131 of the high-frequency filter 500 are assigned with multiple functions. A PA 909 and the wiring between a reception signal input terminal of the transceiver 941, and the eighth output terminal 568 and the ninth output terminal 569 of the high-frequency filter 500 are assigned with multiple functions. With this, the wiring can be further simplified.

Sixth Embodiment

Figure 6:
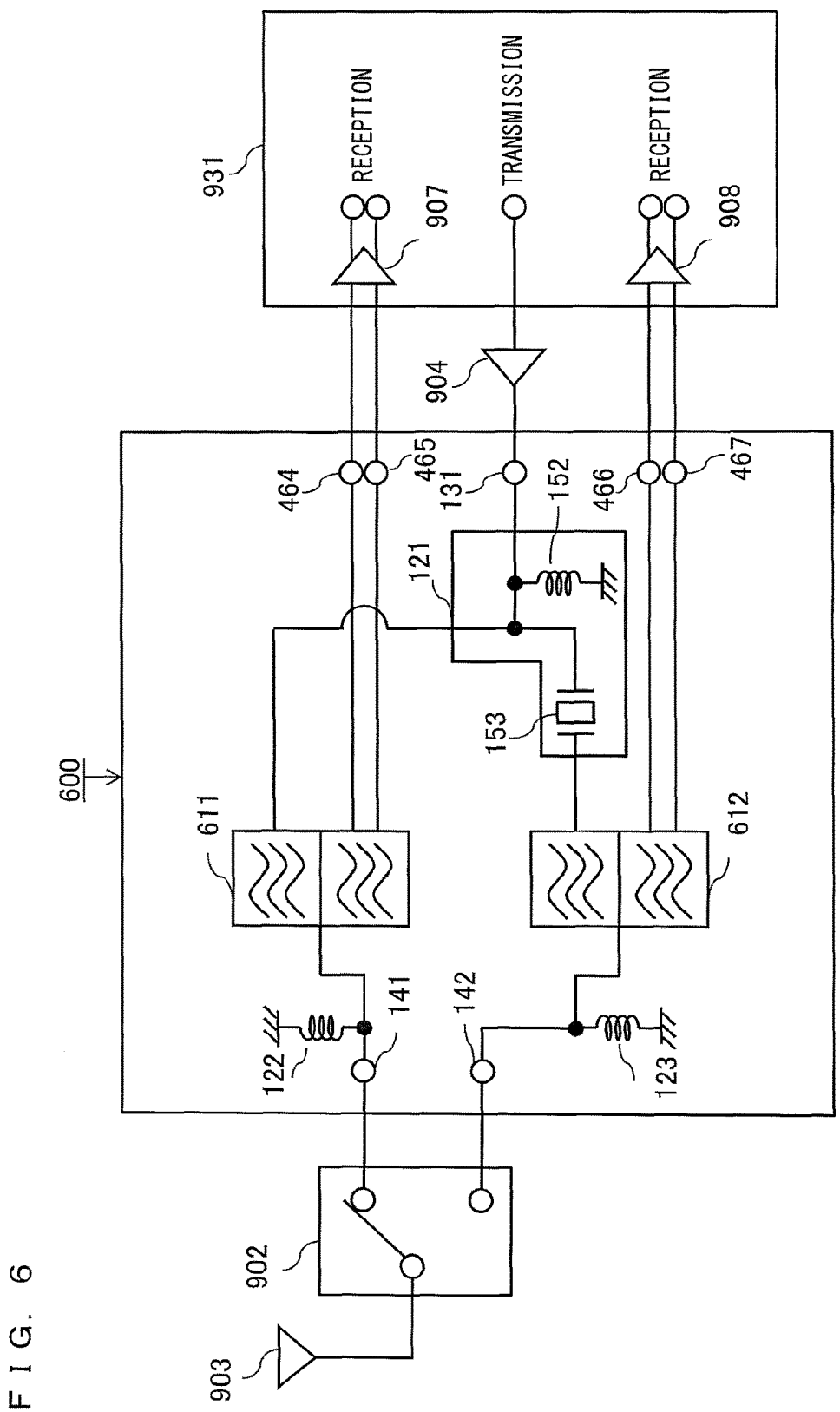
FIG. 6 shows the configuration and connection mode of the high-frequency filter according to a sixth embodiment of the present invention.

In the following, a sixth embodiment of the present invention will be described. FIG. 6 is a configurational drawing of a high-frequency filter 600 according to the present embodiment. The high-frequency filter 600 is obtained by, in the high-frequency filter 400 according to the fourth embodiment, forming the first transmission filter 111 and the first reception filter 413 with a first duplexer 611, and forming the second transmission filter 112 and the second reception filter 414 with a second duplexer 612. The connection mode of the high-frequency filter 600 with respect to an antenna and a transceiver is similar to that of the high-frequency filter 400 according to the fourth embodiment shown in FIG. 4. Therefore, it becomes unnecessary to provide a switch for switching an input destination of transmission signals or a circuit for controlling this switching, and thereby wiring and circuits can be simplified.

It should be noted that, in the high-frequency filter 600, although a set including the first transmission filter 111 and the first reception filter 413 and a set including the second transmission filter 112 and the second reception filter 414 are both formed with a duplexer, it is possible to form only either one of those with a duplexer.

Seventh Embodiment

Figure 7:
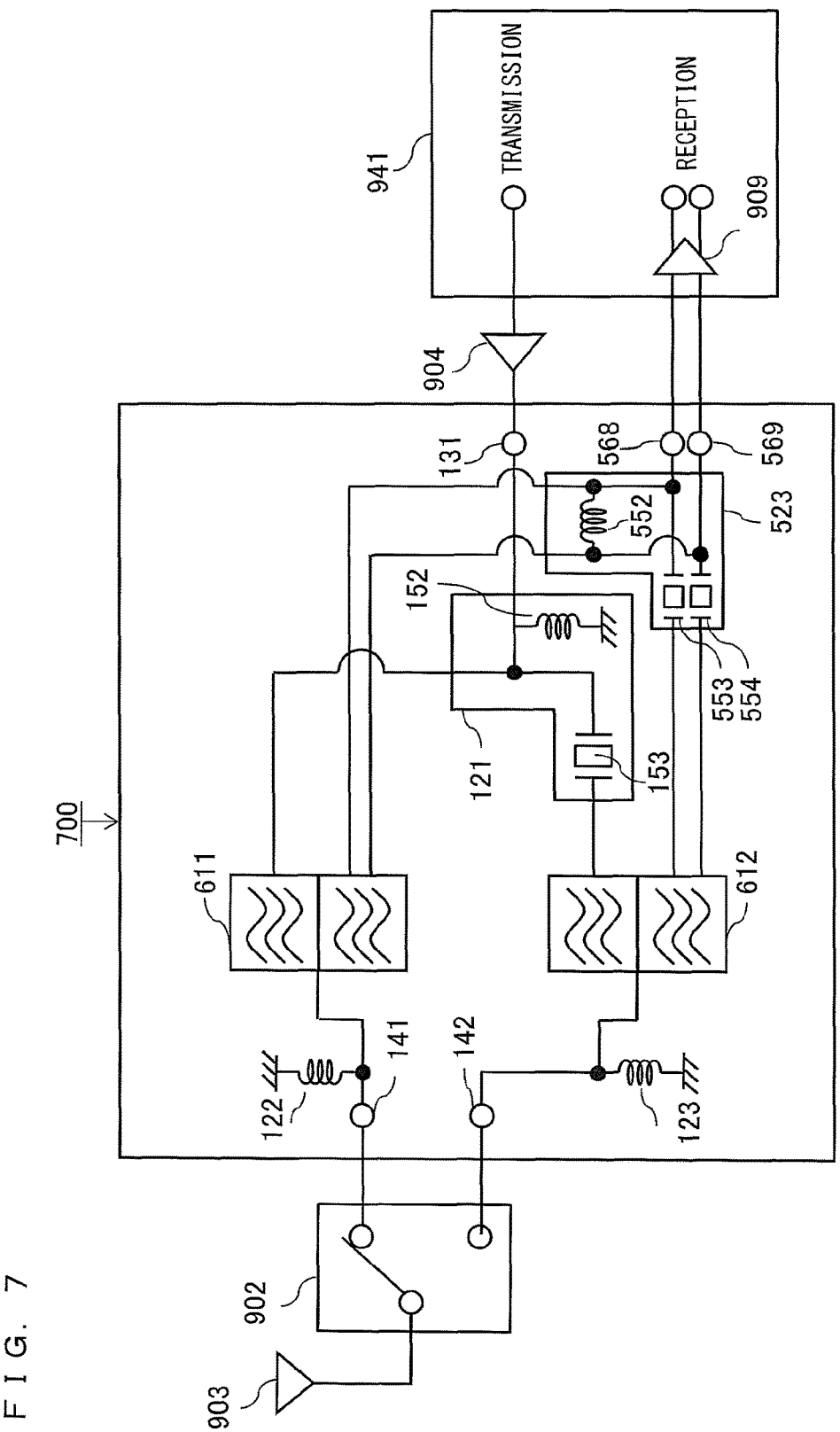
FIG. 7 shows the configuration and connection mode of the high-frequency filter according to a seventh embodiment of the present invention.

In the following, a seventh embodiment of the present invention will be described. FIG. 7 is a configurational drawing of a high-frequency filter 700 according to the present embodiment. The high-frequency filter 700 is obtained by, in the high-frequency filter 500 according to the fifth embodiment, forming the first transmission filter 111 and the first reception filter 413 with a first duplexer 711, and by forming the second transmission filter 112 and the second reception filter 414 with a second duplexer 712. The connection mode of the high-frequency filter 700 with respect to an antenna and a transceiver is similar to that of the high-frequency filter 500 according to the fifth embodiment shown in FIG. 5. Furthermore, the PA 904 and the wiring between a transmission signal output terminal of the transceiver and the input terminal 131 of the high-frequency filter 500 are assigned with multiple functions. In addition, the PA 909 and the wiring between a reception signal input terminal of the transceiver 941, and the eighth output terminal 568 and the ninth output terminal 569 of the high-frequency filter 500 are assigned with multiple functions. With this, the wiring can be further simplified.

It should be noted that, in the high-frequency filter 700, although a set including the first transmission filter 111 and the first reception filter 413 and a set including the second transmission filter 112 and the second reception filter 414 are both formed with a duplexer, it is possible to form only either one of those with a duplexer.

As another embodiment, in the high-frequency filters 200 and 300 according to the second and third embodiments, it is possible to form at least one set, among a set including the first transmission filter 111 and the first reception filter 211, and a set including the second transmission filter 112 and the second reception filter 212, with a duplexer.

Example 1

A first Example of the present invention will be described. A high-frequency filter 800 according to the present Example is obtained by, in the high-frequency filter 500 according to the fifth embodiment, forming the first transmission filter 111 and the first reception filter 413 so as to respectively support frequency bandwidth of transmission and reception in band 5 (transmission: 824 to 849 MHz, reception: 869 to 894 MHz), and forming the second transmission filter 112 and the second reception filter 414 so as to respectively support frequency bandwidth of transmission and reception in band 8 (transmission: 880 to 915 MHz, reception: 925 to 960 MHz).

Thus, the frequency band of the passband of the second transmission filter 112 is higher than the frequency band of the passband of the first transmission filter 111, the frequency band of the passband of the second reception filter 414 is higher than the frequency band of the passband of the first reception filter 413, and the frequency band of the passband of the second transmission filter 112 and the frequency band of the passband of the first reception filter 413 partially overlap.

Figure 8:
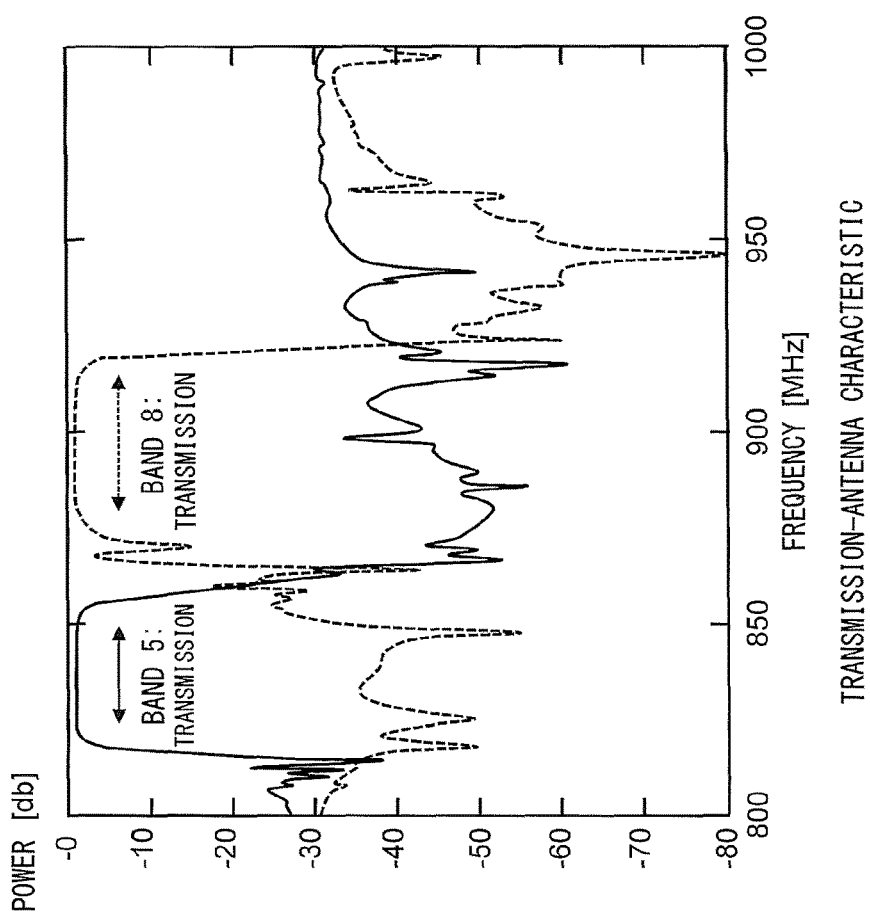
FIG. 8 shows characteristics of the high-frequency filter according to a first Example of the present invention.

FIG. 8 is a graph showing pass characteristic between the antenna and the input terminal 131 when the antenna switch 902 shown in FIG. 5 is switched to the first antenna terminal 141 side and when the antenna switch 902 is switched to the second antenna terminal 142 side. It can be understood therefrom that passbands corresponding to the frequency bandwidth of transmission signals of band 5 and band 8 are each achieved.

Figure 9:
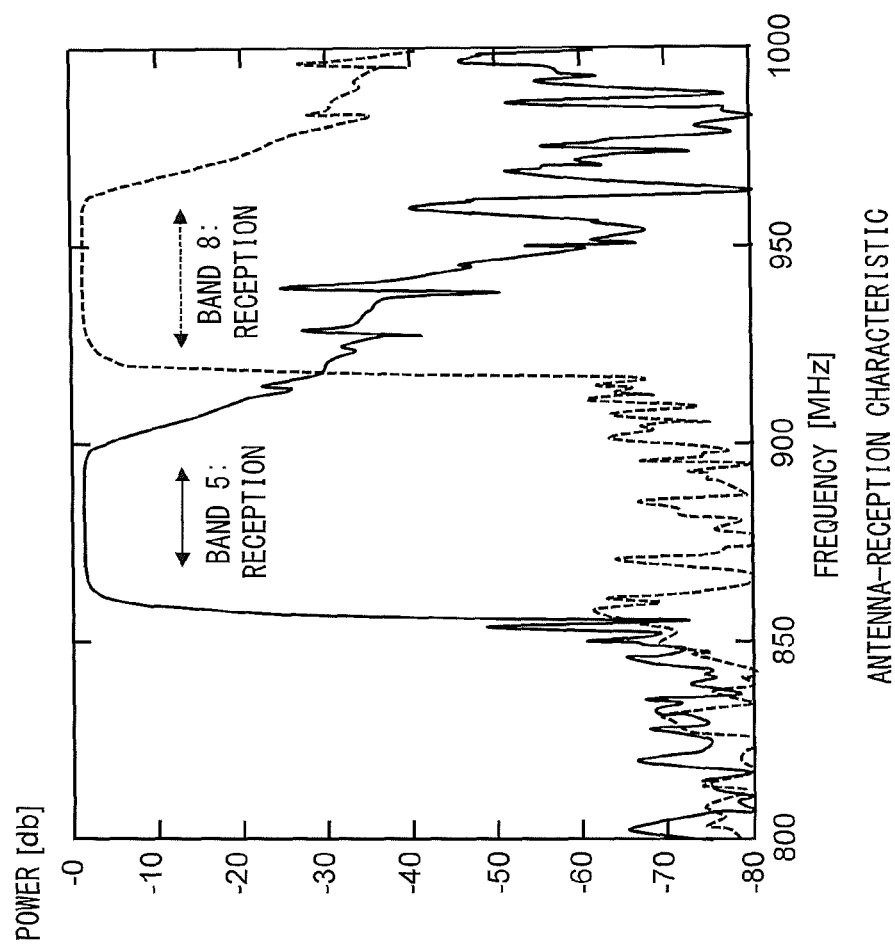
FIG. 9 shows characteristics of the high-frequency filter according to the first Example of the present invention.

FIG. 9 is a graph showing pass characteristic between the antenna and the eighth output terminal 568 (the ninth output terminal 569) when the antenna switch 902 shown in FIG. 5 is switched to the first antenna terminal 141 side and when the antenna switch 902 is switched to the second antenna terminal 142 side. It can be understood therefrom that passbands corresponding to the frequency bandwidth of reception signals of band 5 and band 8 are each achieved.

Figure 10:
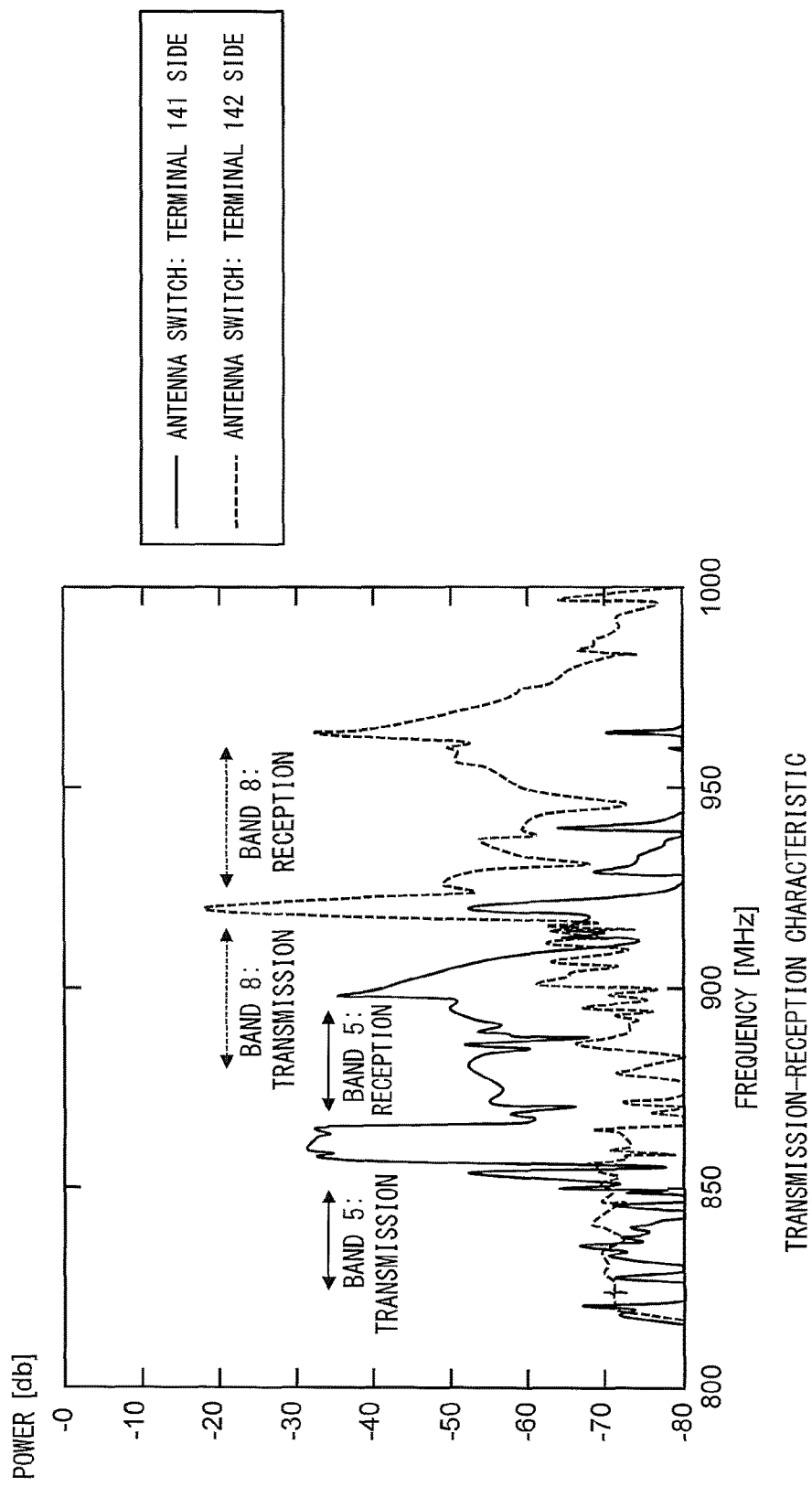
FIG. 10 shows characteristics of the high-frequency filter according to the first Example of the present invention.

FIG. 10 is a graph showing pass characteristic between the input terminal 131 and the eighth output terminal 568 (the ninth output terminal 569) when the antenna switch 902 shown in FIG. 5 is switched to the first antenna terminal 141 side and when the antenna switch 902 is switched to the second antenna terminal 142 side. It can be understood therefrom that isolation is ensured in frequency bandwidth of transmission-and-reception signals in both band 5 and band 8.

Example 2

Figure 11:
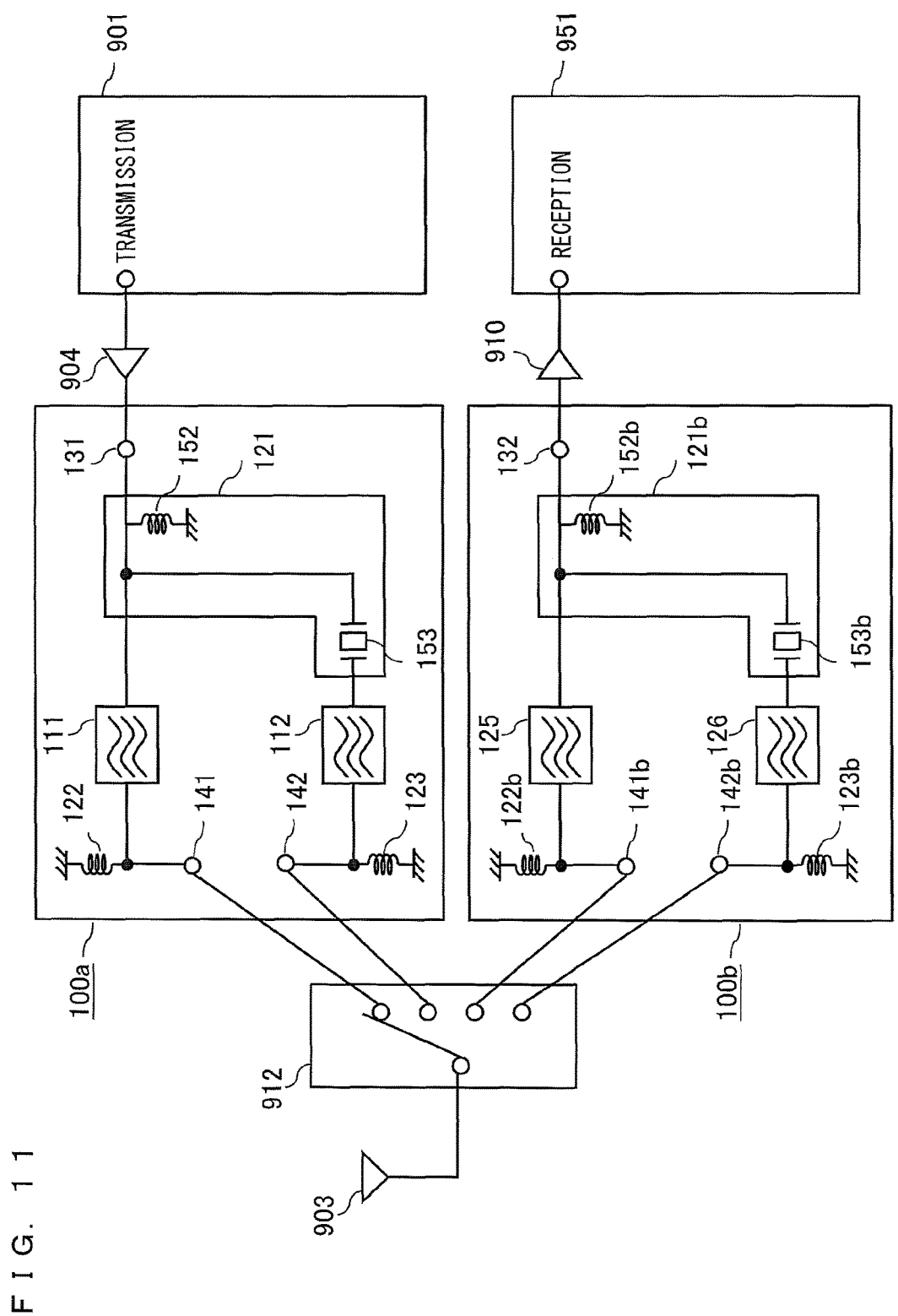
FIG. 11 shows the configuration and connection mode of the high-frequency filter according to a second Example of the present invention.
Figure 12:
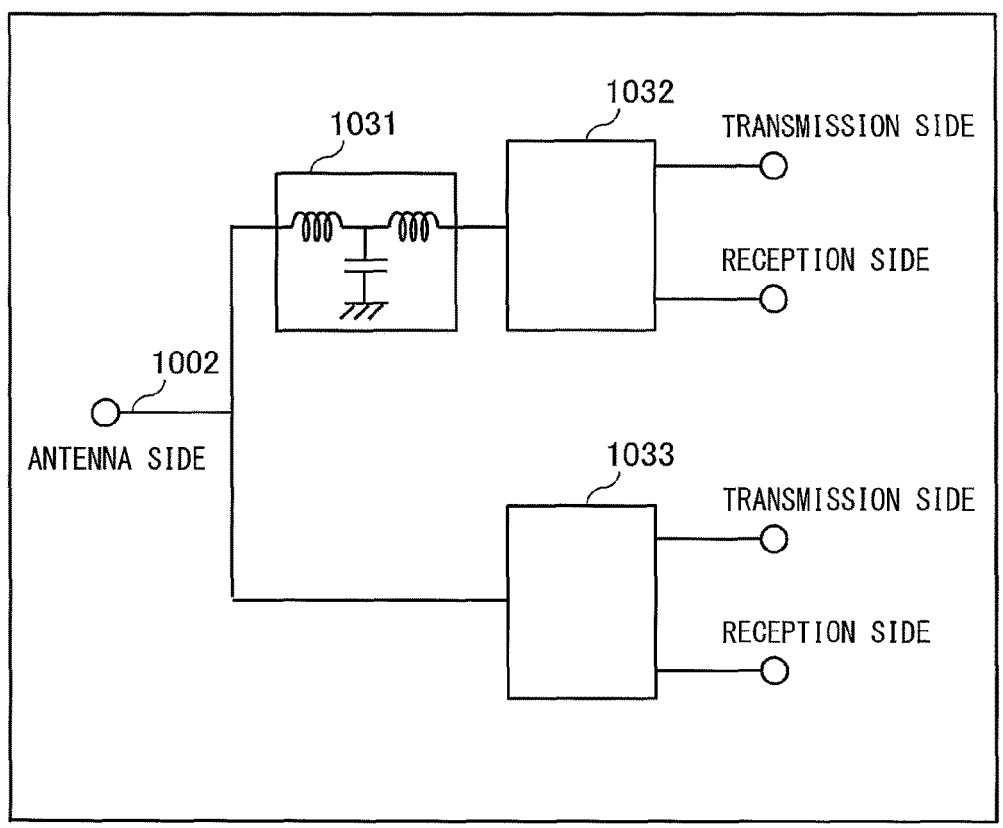
FIG. 12 shows the configuration of a hitherto known multi-duplexer module.
Figure 13:
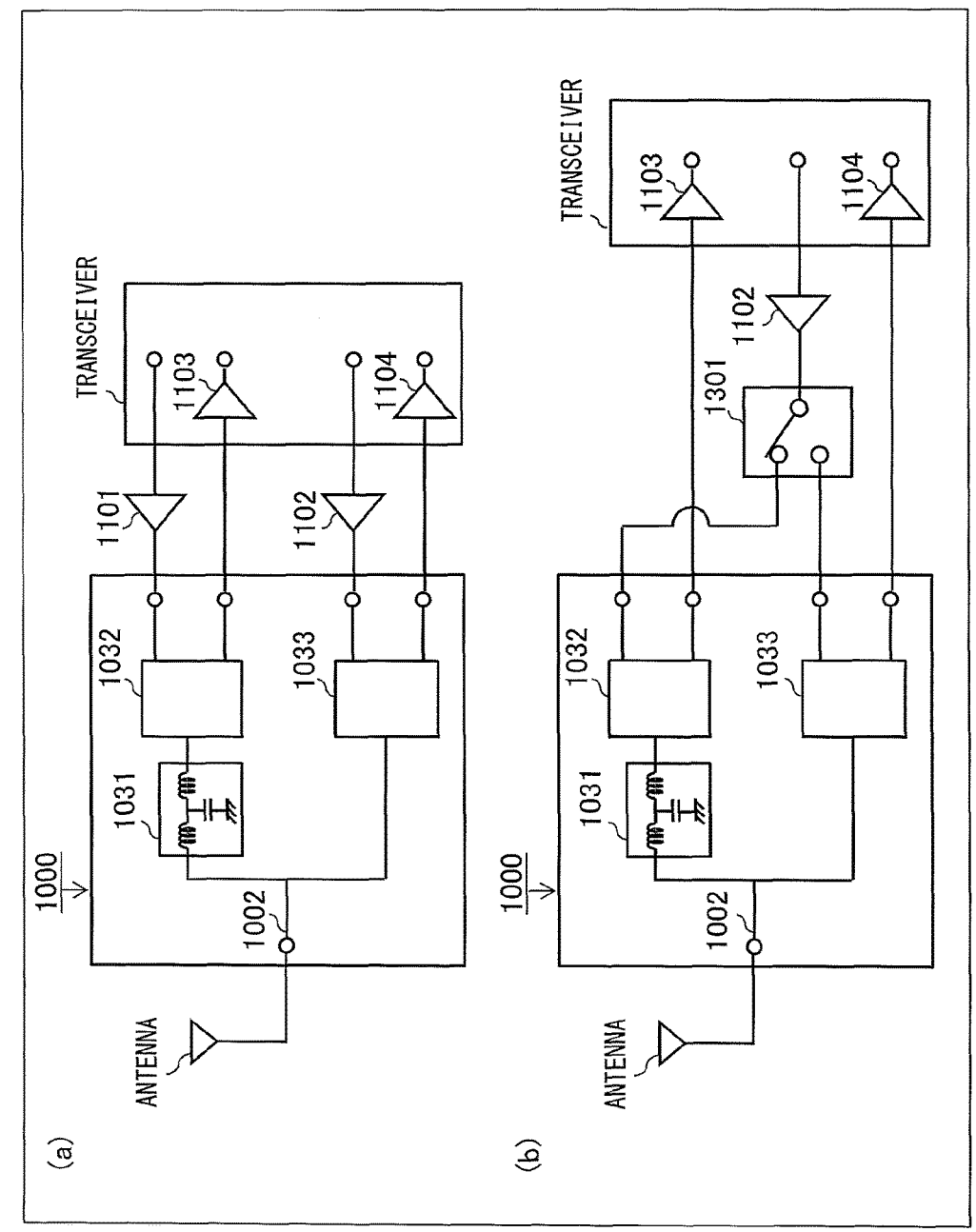
FIG. 13 shows connection modes of the hitherto known multi-duplexer module.

A second Example of the present invention will be described. FIG. 11 shows a configuration of the present Example. The present Example is formed using high-frequency filters 100*a* and 100*b*, and is used for communication utilizing the TDD (Time Division Duplex) method of alternately conducting transmission and reception in a time divisional manner. As the high-frequency filter 100*a*, the high-frequency filter 100 according to the first embodiment is used. The high-frequency filter 100*b* is obtained by including, to the high-frequency filter 100, a first reception filter 125 and a second reception filter 126 instead of the first transmission filter 111 and the second transmission filter 112, and by including an output terminal 132 instead of the input terminal 131; and thereby the high-frequency filter 100*b* functions as a filter for reception. Other components are similar to those in the high-frequency filter 100, and are referred to with reference characters containing identical numbers. In one example, the first transmission filter 111 and the second transmission filter 112 of the high-frequency filter 100*a* respectively support frequency bandwidth for transmission in band 5 and transmission in band 8, and the first reception filter 125 and the second reception filter 126 of the high-frequency filter 100*b* respectively support frequency bandwidth for reception in band 5 and reception in band 8.

To the input terminal 131 of the high-frequency filter 100*a*, transmission signals outputted from the transceiver 901 and amplified by the PA 904 are inputted. The first antenna terminal 141 and the second antenna terminal 142 are connected to the antenna 903 via an antenna switch 912.

A first antenna terminal 141*b* and a second antenna terminal 142*b* of the high-frequency filter 100*b* are connected to the antenna 903 via the antenna switch 912, and reception signals are inputted thereto. Output signals from the output terminal 132 are amplified by a PA 910 and inputted to a transceiver 951.

The antenna switch 912 switches the connection destination of the antenna 903 to any one of the first antenna terminal 141 and the second antenna terminal 142 of the high-frequency filter 100*a*, and the first antenna terminal 141*b* and the second antenna terminal 142*b* of the high-frequency filter 100*b*. With this, switching can be conducted among transmission in band 5, transmission in band 8, reception in band 5, and reception in band 8. Communication using two bands with the TDD method can be attained by repeating such switching in predetermined time slices.

Although each of the embodiments and Examples of the high-frequency filter of the present invention has been described above, the present invention can be achieved not only with the high-frequency filter by itself, but also can be achieved as a part of other electronic circuit modules when combined with other filters etc. Furthermore, the above described antenna switches, PAs for transmission signal, etc., may be constituent elements of the high-frequency filter. Still further, although the high-frequency filter has been described above as to be applied to wireless transceivers, the high-frequency filter may be used as a filter for other use application.

INDUSTRIAL APPLICABILITY

The present invention is useful as a high-frequency filter used in mobile phones etc., and is particularly useful as a high-frequency filter capable of handling multiple bands.

DESCRIPTION OF THE REFERENCE CHARACTERS 100, 100*a*, 200, 300, 400, 500, 600, 700, 800 high-frequency filter
111, 112, 125, 126 transmission filter
121, 121*b*, 122, 123, 322, 523 matching circuit
131 input terminal
141, 141*b*, 142, 142*b* antenna terminal
152, 152*b*, 352 inductor
153, 153*b*, 353, 553, 554 resonator
211, 212, 413, 414 reception filter
132, 261, 262, 263, 363, 464, 465, 466, 467, 568, 569 output terminal
611, 612 duplexer
901, 911, 921, 931, 941, 951 transceiver
902, 912 antenna switch
903 antenna
904, 905, 906, 907, 908, 909, 910 PA
1000 multiplexer module
1002 antenna terminal
1031 matching circuit
1032 first duplexer
1033 second duplexer
1301 switch

The invention claimed is:

1. A high-frequency filter comprising:
a first input to receive a first signal;
a first filter;
a second filter;
a first matching circuit connected to an input of the first filter and to an input of the second filter, the first signal being provided to one of the input of the first filter and the input of the second filter via the first matching circuit, the first matching circuit including a first resonator connected in series between the first input and the input of only one of the first filter and the second filter;
a second input to receive a second signal;
a first reception filter; and
a second reception filter, the first filter being a first transmission filter, and the second filter being a second transmission filter, the first signal being a transmission signal, and the second signal being a reception signal that is provided to the first reception filter and to the second reception filter.

2. The high-frequency filter of claim 1 wherein a frequency band of a passband of the second transmission filter is higher than a frequency band of a passband of the first transmission filter, a frequency band of a passband of the second reception filter is higher than a frequency band of a passband of the first reception filter, and the frequency band of the passband of the second transmission filter and the frequency band of the passband of the first reception filter partially overlap.

3. The high-frequency filter of claim 1 further comprising a second matching circuit connected to an output of the first reception filter and to an output of the second reception filter.

4. The high-frequency filter of claim 3 wherein the second matching circuit includes a second resonator connected in series to the output of one of the first reception filter and the second reception filter, the one of the first reception filter and the second reception filter to which the second resonator is connected having a passband having a higher frequency than a frequency of a passband of the other of the first reception filter and the second reception filter.

5. A high-frequency filter comprising:
a first output to output a first signal;
a first filter and a second filter, the first filter being a first reception filter and the second filter being a second reception filter;
an antenna switch connected to an input of the first reception filter and to an input of the second reception filter; and
a first matching circuit connected to an output of the first filter and to an output of the second filter, the first signal being provided to the first output from one of the output of the first filter and the output of the second filter via the first matching circuit, the first matching circuit including a resonator connected in series between the first output and the output of only one of the first filter and the second filter.

6. The high-frequency filter of claim 5 further comprising a second matching circuit electrically connected between an input of the high-frequency filter and inputs of both the first reception filter and the second reception filter.

7. A high-frequency filter comprising:
an input to receive a reception signal;
an antenna switchably connected to the input;
a first reception filter having an input and an output, the input of the first reception filter being coupled to the input of the high-frequency filter;
a second reception filter having an input and an output, the input of the second reception filter being coupled to the input of the high-frequency filter; and
a first matching circuit connected to the output of the first reception filter and to the output of the second reception filter.

* * * * *